United States Patent
Kupezki

(10) Patent No.: US 11,071,217 B2
(45) Date of Patent: Jul. 20, 2021

(54) DEVICE FOR FASTENING A PLATE

(71) Applicant: HELLA GMBH & CO. KGAA, Lippstadt (DE)

(72) Inventor: Andreas Kupezki, Guetersloh (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/722,999

(22) Filed: Dec. 20, 2019

(65) Prior Publication Data
US 2020/0128684 A1 Apr. 23, 2020

Related U.S. Application Data

(63) Continuation of application No. PCT/EP2018/065321, filed on Jun. 11, 2018.

(30) Foreign Application Priority Data

Jun. 20, 2017 (DE) .................... 10 2017 113 508.1

(51) Int. Cl.
*H05K 5/02* (2006.01)
*F16B 5/06* (2006.01)

(52) U.S. Cl.
CPC ........... *H05K 5/0217* (2013.01); *F16B 5/065* (2013.01)

(58) Field of Classification Search
None
See application file for complete search history.

(56) References Cited

U.S. PATENT DOCUMENTS

| 5,268,820 A * | 12/1993 | Tseng | H05K 1/141 361/760 |
| 6,094,057 A * | 7/2000 | Hiruta | G01R 1/0483 324/756.01 |
| 6,234,820 B1 * | 5/2001 | Perino | H01R 12/7005 439/326 |
| 6,424,540 B1 * | 7/2002 | Chen | G06F 1/184 174/377 |
| 6,441,485 B1 * | 8/2002 | Glenn | H01L 23/32 257/727 |

(Continued)

FOREIGN PATENT DOCUMENTS

| DE | 102012217059 A1 | 3/2014 |
| DE | 102013208177 A1 | 11/2014 |

(Continued)

OTHER PUBLICATIONS

International Search Report dated Sep. 25, 2018 in corresponding application PCT/EP2018/065321.

*Primary Examiner* — Oscar C Jimenez
(74) *Attorney, Agent, or Firm* — Muncy, Geissler, Olds & Lowe, P.C.

(57) ABSTRACT

A device for fastening a plate, comprising a receiving structure with an abutment for receiving the plate and a fastener for fastening of the plate. The device should be produced at low cost, allow for average production tolerances and be susceptible to little wear. This is achieved in that a fastener for fastening comprise at least one snap arm, which can in each case swivel in an elastic manner about an axis perpendicular to a main surface of the plate and which presses the received plate against the abutment under pretension.

15 Claims, 2 Drawing Sheets

(56) References Cited

U.S. PATENT DOCUMENTS

| | | | | |
|---|---|---|---|---|
| 6,785,146 | B2* | 8/2004 | Koike | H05K 7/1417 |
| | | | | 361/740 |
| 6,945,794 | B1* | 9/2005 | Yang | H01R 13/6215 |
| | | | | 439/331 |
| 7,004,764 | B2* | 2/2006 | Boudreau | H05K 7/142 |
| | | | | 174/138 G |
| 7,300,298 | B2 | 11/2007 | Kameda | |
| 8,564,971 | B2* | 10/2013 | Sun | G06F 1/187 |
| | | | | 361/807 |
| 9,467,186 | B2* | 10/2016 | Wu | H04B 1/3816 |
| 2008/0007931 | A1* | 1/2008 | Hartman | H05K 7/142 |
| | | | | 361/810 |
| 2010/0020485 | A1* | 1/2010 | Huang | G06F 1/187 |
| | | | | 361/679.36 |

FOREIGN PATENT DOCUMENTS

| | | | |
|---|---|---|---|
| EP | 1587349 | A1 | 10/2005 |
| EP | 2819495 | A2 | 12/2014 |

\* cited by examiner

DEVICE FOR FASTENING A PLATE

This nonprovisional application is a continuation of International Application No. PCT/EP2018/065321, which was filed on Jun. 11, 2018, and which claims priority to German Patent Application No. 10 2017 113 508.1, which was filed in Germany on Jun. 20, 2017, and which are both herein incorporated by reference.

BACKGROUND OF THE INVENTION

Field of the Invention

The present invention relates to a device for fastening a plate, comprising a receiving structure with an abutment for receiving the plate and a fastener for fastening the plate.

Description of the Background Art

Such devices are known per se and are designed, for example, as an electrical and/or electronic device, with a housing as a receiving structure and at least one printed circuit board. They are often used, e.g., in motor vehicles, as sensors and/or control devices.

For fastening the circuit board in or on the housing, different options are known, such as screws, gluing, heat stacking or latching.

Screwing and gluing have the disadvantage that they are relatively expensive. Heat staking is relatively costly and requires special tools. The connection between the rivets and the plate is rigid, which can cause higher mechanical stresses.

The known latching connections comprise latches which are parallel to a plane of a main surface of the plate about an axis. As a result, a very high production accuracy must be maintained; for example, thickness tolerances of the plate cannot be compensated. During operation of the motor vehicle, vibrations can occur between the plate and the receiving structure, which can lead to wear.

SUMMARY OF THE INVENTION

It is therefore an object of the present invention to provide a device for fastening a plate, which can be produced low in cost, allows for average production tolerances and is not highly susceptible to wear.

In an exemplary embodiment, the fastener comprises at least one snap arm, each of which can swivel in an elastic manner about an axis perpendicular to a main surface of the plate and which presses the received plate against the abutment under pre-tension. The ability of each of the snap arms to swivel perpendicular to the main surface has the effect that a distance between the abutment and a contact surface—this is a flat surface due to the end of the snap arm facing the abutment—may be smaller than an average thickness of the plate. This ensures that the snap arms exert a predetermined average pressure on the plate. This reliably prevents vibration between the plate and the receiving structure, even in the case of, for example, temperature variations and within predetermined production tolerances, which can disrupt the electrical functions and lead to faster wear. The elasticity simplifies assembly.

The plate can be a printed circuit board. To that end, the invention can be used particularly advantageously.

The receiving structure can be part of a housing. In this regard, the plate is both held as well as protected from external influences.

In a further embodiment, the abutment is formed linearly and supports an edge region of the plate. In this case, e.g., a frame or end faces of walls can be used as support for the plate without the need for further measures Alternatively, the abutment is formed punctiform, that is, with a small, round or rectangular support surface of, e.g., 2 mm$^2$. In this case, the abutments are formed as domes, which protrude from a bottom or top surface and have flat end faces as a support surface. In this case, only a small area of the plate is needed for support. A number of the punctiform abutments corresponds to, for example, the number of the snap arms. In addition, press-in domes may be present.

In the punctiform design of the abutments, a contact surface of each of the snap arms is advantageously arranged opposite the associated abutment. As a result, a contact force of the snap arm is introduced in a straight line in the abutment via the printed circuit board. This prevents the introduction of bending moments in the plate, so that it remains largely free of mechanical stresses and can be manufactured accordingly cheaper.

In a further embodiment, the snap arms are made in one piece with the receiving structure, in particular made of plastic in an injection molding process. This simplifies production.

In a further embodiment, the snap arms are formed curved in their longitudinal extension. This facilitates mounting of the plate in or on the receiving structure.

In a further embodiment, in the operating direction, the snap arms are designed to be more rigid perpendicular to the plate than parallel to it. This is achieved, for example, by the shape of the cross section of the snap arms and achieves a secure fastening of the plate by sufficient pressure exerted by the snap arms.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
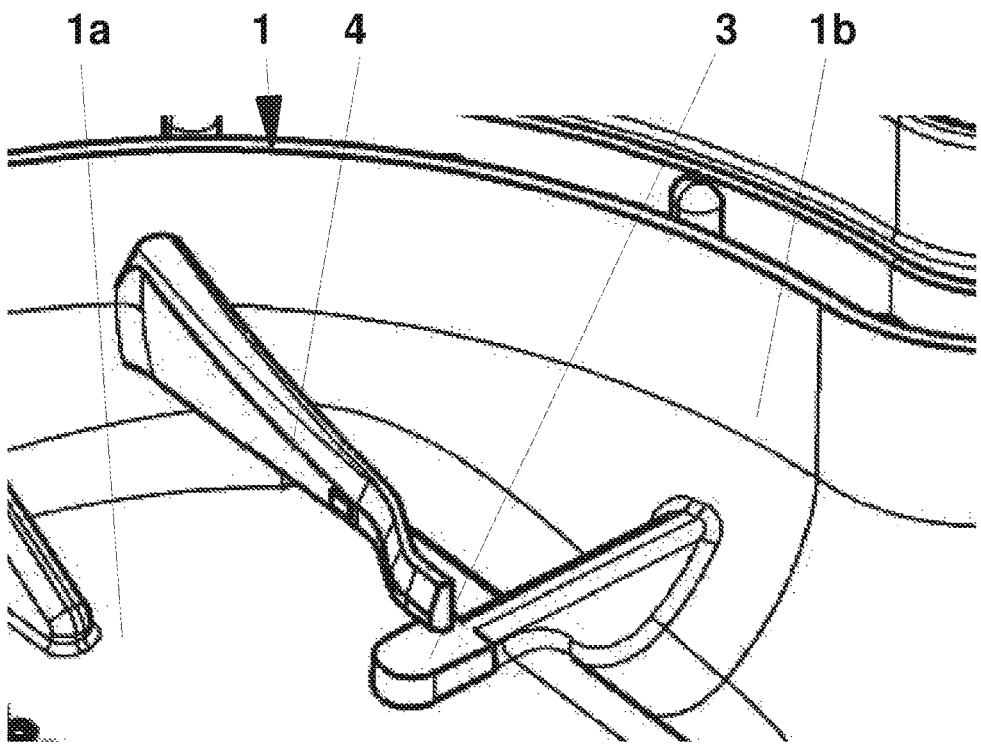
FIG. 1 is a perspective view of a housing part with a snap arm and an abutment.
Figure 2:
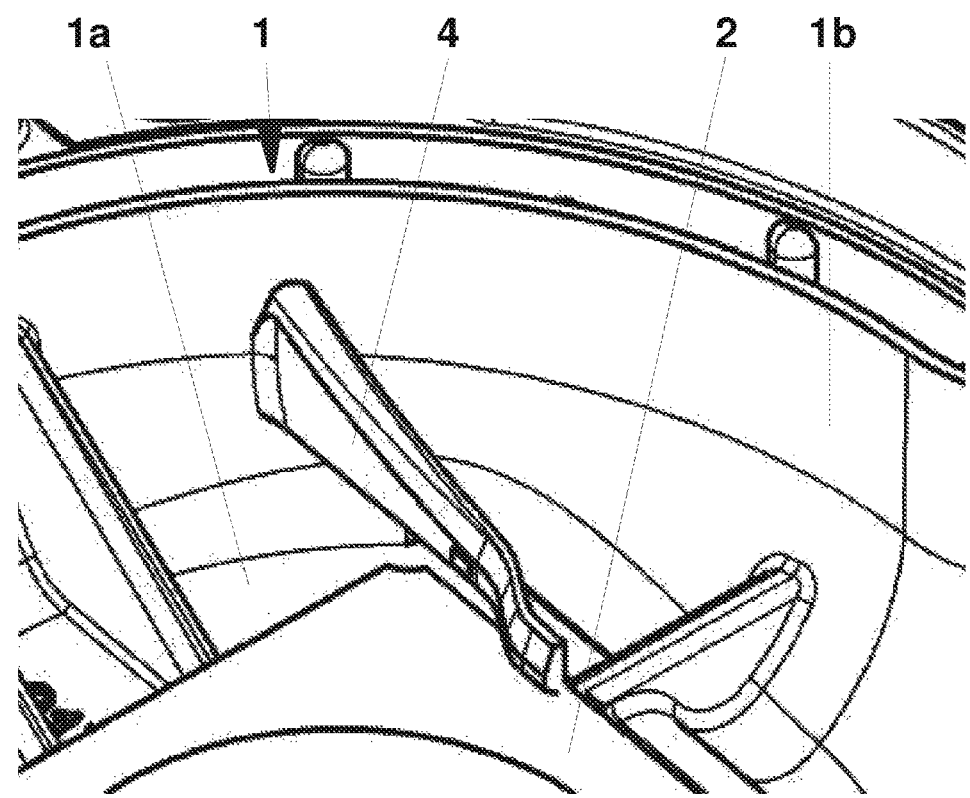
FIG. 2 shows the housing part of FIG. 1 with an inserted printed circuit board.

As can be seen from FIGS. 1 and 2, a plate in the form of a printed circuit board 2 is mounted in a housing part 1, which is only partially shown and forms a receiving structure.

The housing part 1 is formed, for example, as a trough-like bottom or cover part of a housing.

At a bottom 1a of the housing part 1, a plurality of, for example, four domes 3 is arranged which form punctiform abutments, each with a support surface. All support surfaces are located in a common plane parallel to the bottom 1a. Each of the support surfaces and thus a cross section of the dome 3 is U-shaped, wherein a rounding of the U points away from a wall 1b of the housing part.

Each of the domes 3 is assigned a snap arm 4. Each of the snap arms 4 is formed directly in one piece with and on a wall 1b of the housing part 1 protruding into the interior thereof. A length of the snap arm 4 is dimensioned such that its free end is at a predetermined distance in the region of the associated support surface and that elastic movements of the free end are made possible parallel and perpendicular to the support surface and thus also parallel to a main surface of the plate 2. The distance between the support surface and a contact surface—this is a side facing the support surface in the area of the free end—is undersized such that it corresponds to a thickness of the plate 2. This ensures that the snap arm 4 presses the plate against the support surface.

A cross section of the snap arm 4 is substantially rectangular and tapers towards the free end. In this way, in conjunction with a length of the snap arm 4 and the material selection, the elasticity of the snap arm 4 and thus a restoring and contact force can be set. A bottom side of the snap arm 4, according to the figures, is parallel to the bottom 1a.

Furthermore, a side surface of the snap arm 4, which makes contact with the plate 2 during insertion of the latter (the left one in FIGS. 1 and 2), is tapered such in the region of the free end that a top of the snap arm 4 is narrower than its bottom; a cross section of the free end is thus approximately trapezoidal. As a result, assembly of the printed circuit board 2 in the housing part 1 is simplified.

Preferably, in a plan view, the snap arm 4 has a curvature or buckling in a rear region (facing away from the fastening) such that the free end is closer to a corresponding axis of the printed circuit board 2 than the remaining region. As a result, a substantial part of the snap arm 4 does not project beyond the printed circuit board 2 and is therefore available for parts.

In the region of the free end, the contact surface is formed on the bottom of the snap arm 2, which is formed protruding downwards from the bottom. Hereby, only a predetermined small area of the plate 2 is required for attachment. The contact surface and the support surface are opposite each other.

Between the support surface and the left side surface according to FIGS. 1 and 2, an upwardly facing lower slant is formed. In the assembly of the printed circuit board 2, this facilitates a sliding of the free end into a holding position of the snap arm 4.

For mounting the plate 2, it is inserted in the intended orientation into the housing part 1. Here, the snap arms 4 are laterally deflected by a tool in an elastic manner. At the latest when the plate 2 contacts the support surfaces, the snap arms 4 slide into their holding positions, thus fixing the plate 2 in the housing part 1. If necessary, the sliding must be mechanically supported. The undersize of the distance between the support surfaces and the contact surfaces against the thickness of the plate 2 causes a slight pre-tension, so that secure fixation is ensured.

Figure 3:
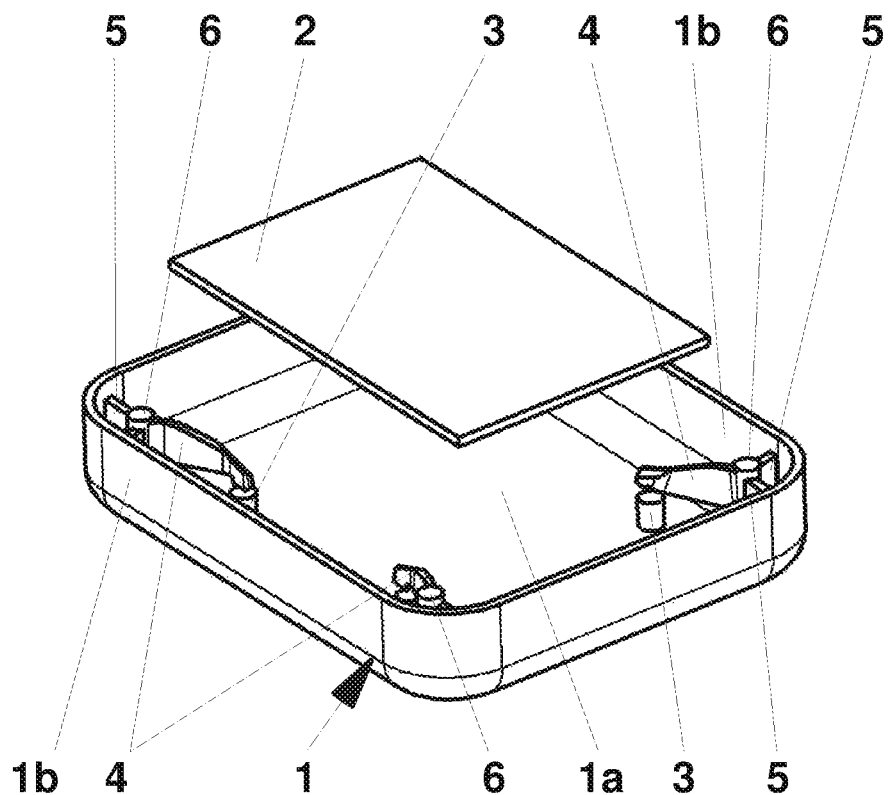
FIG. 3 is a perspective view of another housing part.
Figure 4:
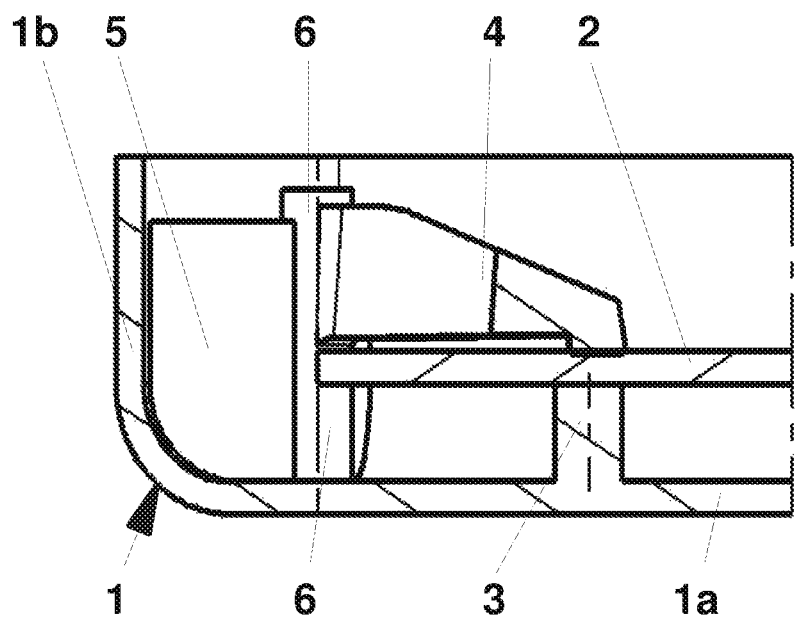
FIG. 4 shows a partial section through the housing part of FIG. 3.

The exemplary embodiment shown in FIGS. 3 and 4 differs from the first one, in addition to the configuration of the housing part 1, by the following:

The domes 3 have a circular cross section.

Each of the snap arms 4 is fastened indirectly in an associated corner region of the approximately cuboidal housing part 1 by two fins 5 and a support 6.

The support 6 has a circular cross section and is molded to the bottom 1a spaced from the associated walls 1b. Said support is stabilized by the fins 5, which are formed between the associated walls 1b and the support 6. The fins 5 form a right angle.

The housing part 1, the dome 3, the snap arms 4, the fins 5 and the supports 6 are integrally formed.

Incidentally, the second embodiment is equivalent to the first.

The assembly of the plate 2 is carried out as in the first exemplary embodiment.

In both embodiments, the snap arms (4) are preferably made in one piece with the receiving structure (1) as part of a housing and with the abutment (3) made of plastic in an injection molding process. For example, PBT (polybutylene terephthalate) can be used as the plastic. Thus, the housing part is sufficiently rigid, and the snap arms have the required elasticity.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A device for fastening a plate, the device comprising:
a receiving structure having at least one abutment for receiving the plate and a fastener for fastening the plate, wherein the fastener comprises at least one snap arm, which is adapted to swivel in an elastic manner about an axis that extends perpendicular to a main surface of the plate, and wherein the at least one snap arm presses the plate against the at least one abutment under pre-tension, and
wherein the receiving structure is a housing part having a bottom wall and side walls that extend from the bottom wall, wherein the at least one snap arm extends from one of the side walls, wherein the plate is positioned such that the main surface of the plate is parallel to the bottom wall and wherein the axis about which the at least one snap arm swivels is parallel to the one of the side walls.

2. The device according to claim 1, wherein the plate is a printed circuit board.

3. The device according to claim 1, wherein the receiving structure is part of a housing.

4. The device according to claim 1, wherein the at least one abutment is formed linearly and supports an edge region of the plate.

5. The device according to claim 1, wherein the at least one abutment is formed punctiform.

6. The device according to claim 5, wherein each of the at least one snap arm has a support surface that opposes and overlaps with a support surface of an associated one of the at least one abutment and wherein the support surface of the at least one snap arm and the support surface of the at least one abutment directly contact the plate.

7. The device according to claim 1, wherein the at least one snap arm is made in one piece with the receiving structure and the at least one abutment.

8. The device according to claim 7, wherein the at least one snap arm is made in one piece with the receiving structure and the at least one abutment as part of a housing and are made of plastic in an injection molding process.

9. The device according to claim 1, wherein, in a longitudinal extension of the at least one snap arm, the at least one snap arm is curved.

10. The device according to claim 1, wherein, the at least one snap arm is formed to be more rigid with respect to movement that is perpendicular to the plate than with respect to movement that is parallel thereto.

11. The device according to claim 1, wherein the at least one abutment extends from another one of the side walls that is directly adjacent to the one of the side walls from which the at least one snap arm extends.

12. The device according to claim 1, wherein a width of the at least one snap arm tapers, such that a free end of the at least one snap arm is narrower than a base of the at least one snap arm.

13. The device according to claim 1, wherein a free end of the at least one snap arm is curved in a direction towards a center point of the main surface of the plate, the main surface of the plate being parallel to a bottom wall of the receiving structure.

14. A device for fastening a plate, the device comprising:
a receiving structure having at least one abutment for receiving the plate and a fastener for fastening the plate,
wherein the fastener comprises at least one snap arm, which is adapted to swivel in an elastic manner about an axis that extends perpendicular to a main surface of the plate, and wherein the at least one snap arm presses the plate against the at least one abutment under pre-tension, and
wherein the receiving structure is a housing part having a bottom wall and side walls that extend from the bottom wall, wherein the at least one snap arm extends from a corner between two of the side walls, wherein the plate is positioned such that the main surface of the plate is parallel to the bottom wall and wherein the axis about which the at least one snap arm swivels is parallel to the side walls.

15. The device according to claim 14, wherein the at least one abutment extends from the bottom wall.

* * * * *